US007518062B2

(12) United States Patent
Nepsha et al.

(10) Patent No.: US 7,518,062 B2
(45) Date of Patent: Apr. 14, 2009

(54) HOLE SEAL FOR ENCLOSURE

(75) Inventors: William Joseph Nepsha, Elk River, MN (US); Steven Edward Hendricks, Coon Rapids, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 0 days.

(21) Appl. No.: 11/558,359

(22) Filed: Nov. 9, 2006

(65) Prior Publication Data
US 2008/0111368 A1 May 15, 2008

(51) Int. Cl.
*H01R 13/46* (2006.01)

(52) U.S. Cl. .................. 174/59; 174/48; 174/480; 174/481; 174/64; 439/535; 248/906

(58) Field of Classification Search .................. 174/48, 174/50, 58–64, 481, 480, 135, 151, 153 G, 174/51; 220/4.02; 439/535, 583, 584, 581, 439/462; 248/906
See application file for complete search history.

(56) References Cited

U.S. PATENT DOCUMENTS

RE38,294 E * 11/2003 Nattel et al. .................. 174/59

* cited by examiner

*Primary Examiner*—Dhiru R Patel
(74) *Attorney, Agent, or Firm*—Greenberg Traurig, LLP

(57) ABSTRACT

A hole seal for an enclosure includes a body having a threaded portion, and a nut having an inner threaded portion to receive the threaded portion of the body, the nut including a first outer flange having first diameter and a second outer flange having a second diameter, larger than the first diameter.

16 Claims, 4 Drawing Sheets

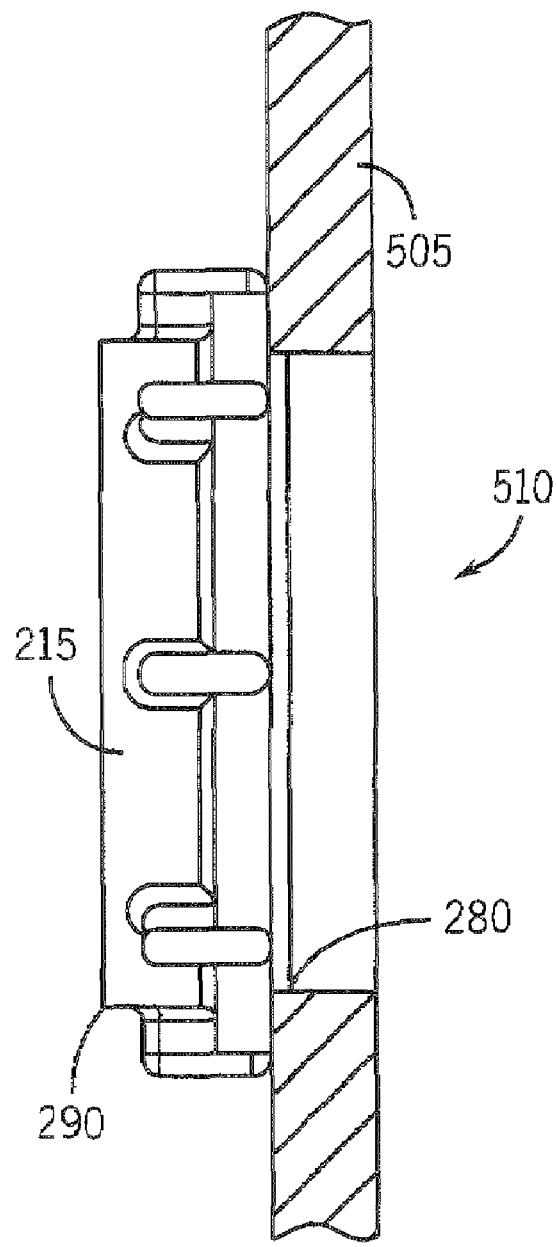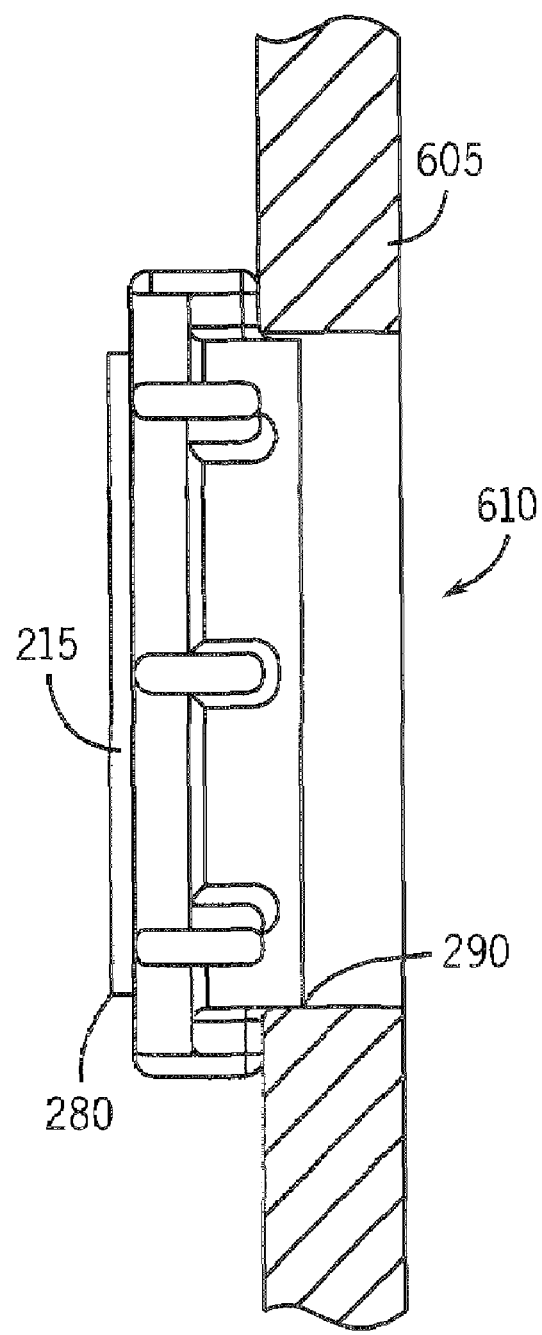
FIG. 5
FIG. 6

HOLE SEAL FOR ENCLOSURE

FIELD OF THE INVENTION

This invention relates to the field of electrical enclosures, and more specifically to a hole seal for an enclosure.

BACKGROUND

Electrical enclosures can be used to house assorted electrical and datacom equipment. The enclosure protects the electrical equipment from the environment and helps prevent access to the equipment. Hole seals are used to cover holes in the enclosure. The holes are used to feed electrical lines or other equipment into and out of the enclosure. When not being used, the hole needs to be sealed. The holes in an enclosure can have a variety of different sizes, thus requiring different size hole seals for a given size hole. This can cause a user to not have the correct size hole seal or require them to have a large number of unneeded hole seals.

SUMMARY

A hole seal for an enclosure includes a body having a threaded portion, and a nut having an inner threaded portion to receive the threaded portion of the body, the nut including a first outer flange having first diameter and a second outer flange having a second diameter, larger than the first diameter.

BRIEF DESCRIPTION OF THE DRAWINGS

FIG. 5 shows a side view of a nut mounted within a hole in an enclosure, in accordance with one embodiment.

FIG. 6 shows a side view of the nut of FIG. 5 mounted within a hole in an enclosure, in accordance with one embodiment.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the scope of the present invention. Therefore, the following detailed description is not to be taken in a limiting sense, and the scope of the present invention is defined by the appended claims and their equivalents.

Figure 1:
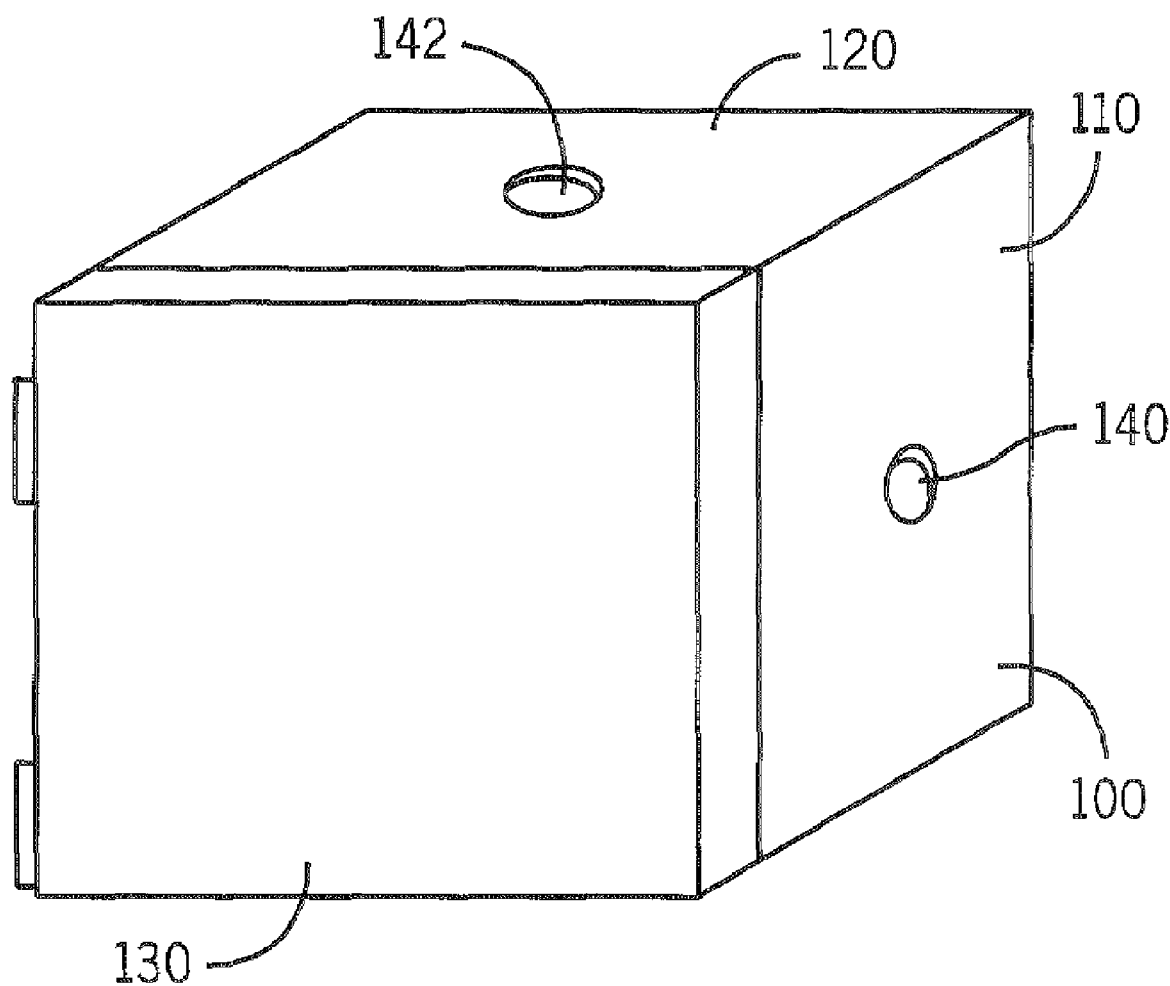
FIG. 1 shows a perspective view of an enclosure according to one embodiment.

FIG. 1 shows a perspective view of an enclosure 100, according to one embodiment. Enclosure 100 includes walls 110 and 120 and a front door 130. Enclosure 100 can be formed of sheet metal, plastic or other materials. One or more holes 140, 142 are located in walls 110 and 120. In other examples, holes can be located in any wall, including the back wall and the front door 130 of enclosure 100. In some examples, holes 140, 142 can include knock-outs, which are partially punched openings meant for optional removal. Holes 140, 142 are provided to accommodate standard cables or conduits. Enclosure 100 can be used to house datacom equipment or other electrical equipment and devices.

Figure 2:
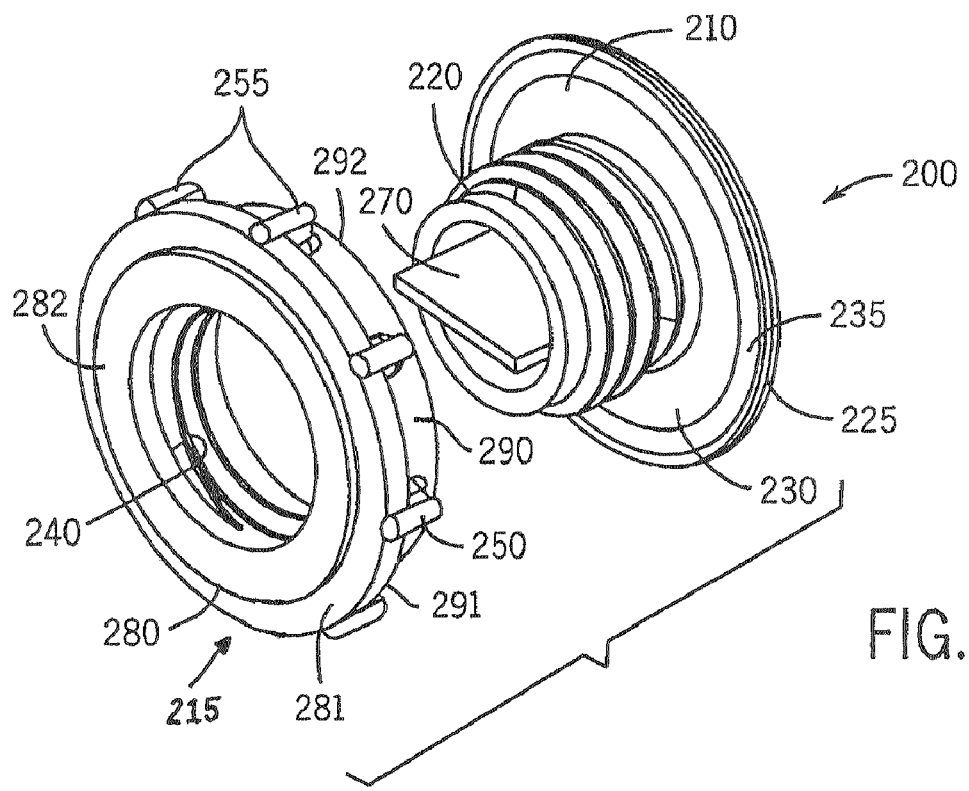
FIG. 2 shows a perspective view of a hole seal for an enclosure, in accordance with one embodiment.
Figures 3, 4:
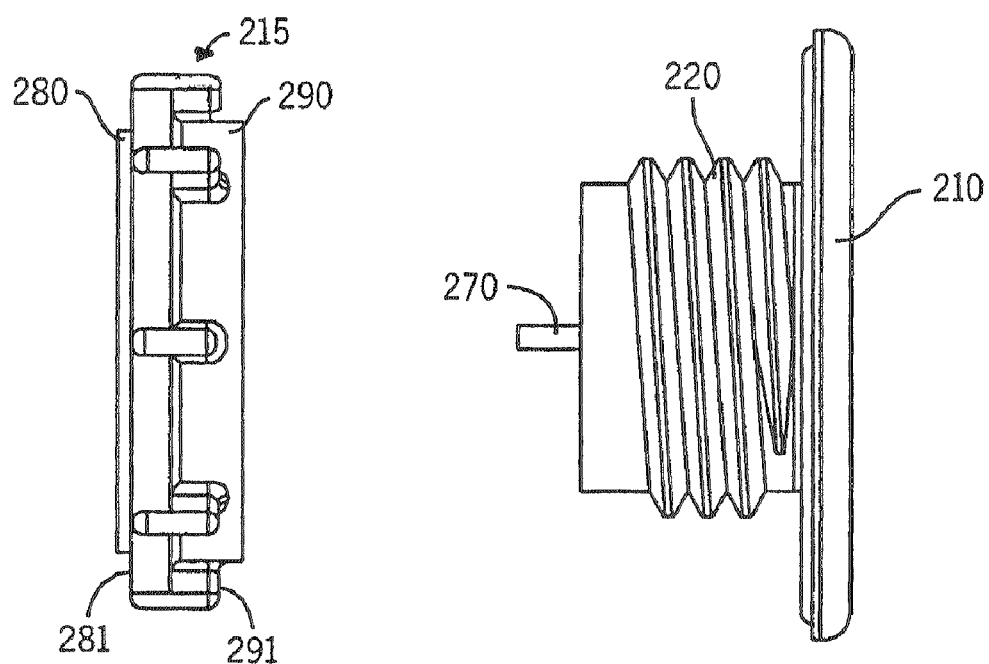
FIG. 3 shows a side view of a nut of a hole seal, in accordance with one embodiment.
FIG. 4 shows a side view of a hole seal body, in accordance with one embodiment.

FIG. 2 shows a perspective view of a hole seal 200 for an enclosure, in accordance with one embodiment. FIGS. 3 and 4 show further details of hole seal 200 with FIG. 3 showing a side view of a nut 215 and FIG. 4 showing a side view of a hole seal body 210.

Hole seal 200 is used to seal the holes described above for enclosure 100. Hole seal 200 is designed so as to be usable for at least two different size holes. This allows a single hole seal to be used for different size holes and thus a user does not need to have an excess supply of hole seals to seal an enclosure.

Hole seal 200 generally includes a body 210 and a nut 215. Body 210 includes a cylindrical threaded portion 220 and a cap end 225. An inner surface 230 of cap end 225 can include a gasket 235. In one example, body 210 is molded of a non-metallic material such as a plastic. A tab 270 can extend from an end of the body 210. Tab 270 provides a grip for a user to hold when mounting the hole seal within the hole of an enclosure. Threaded portion 220 is a male threaded portion and is threaded to threadingly engage nut 215 at a female threaded portion 240 of nut 215.

An outer perimeter surface 250 of nut 215 can include a plurality of ridges 255 to provide additional grip while screwing the nut 215 onto the body 210. In one example, nut 215 is molded of a non-metallic material such as a plastic.

Nut 215 includes a first outer flange 280 having first diameter on a first side 282 and a second outer flange 290 having a second diameter on a second side 292. The flanges 280, 290 have different diameters so as to allow the nut 215 to be mounted to body 210 in different size holes in an enclosure. Flange 280 is a circular raised portion of nut 215 that extends from a first surface 281 of nut 215. Likewise flange 290 is a circular raised portion of the nut that extends from a second surface 291. In this example, outer flanges 280, 290 are on opposite sides of nut 215. In some embodiments, the outer flanges 280, 290 can be on the same side of the nut.

FIGS. 5 and 6 show an example of nut 215 mounted to different size holes 510 and 610 in enclosures 505 and 605, respectively. For example, flange 280 fits matingly within hole 510 so as to generally center nut 215 within the hole. Likewise, flange 290 fits within larger hole 610 so as to generally center nut 215 within the hole. Accordingly, nut 215 is reversible such that the nut can be placed onto the threaded portion of the threaded body 210 (FIG. 2) from either side allowing a single nut to be used for different sized holes.

Figure 7:
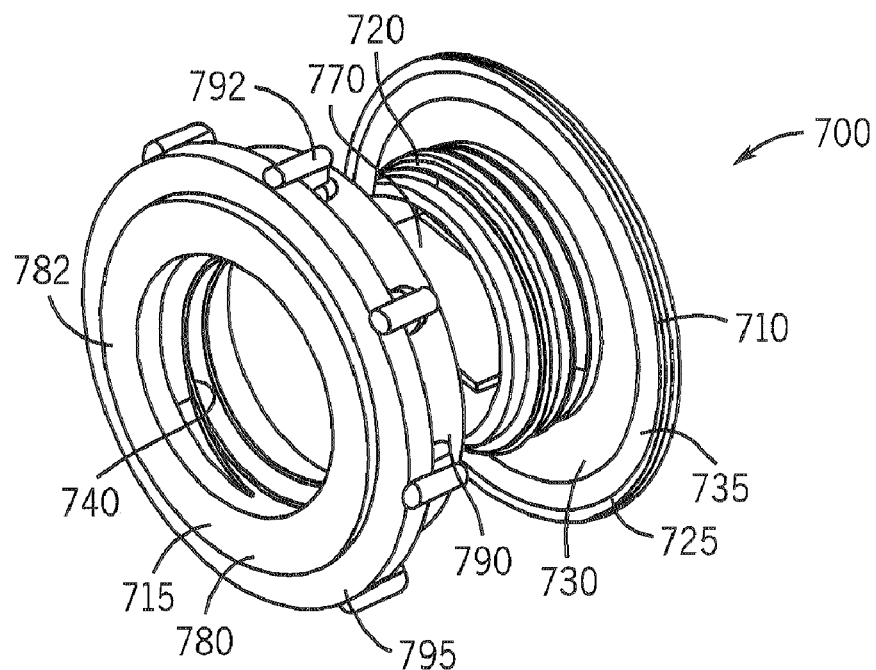
FIG. 7 shows a perspective view of a hole seal for an enclosure, in accordance with one embodiment.
Figure 8:
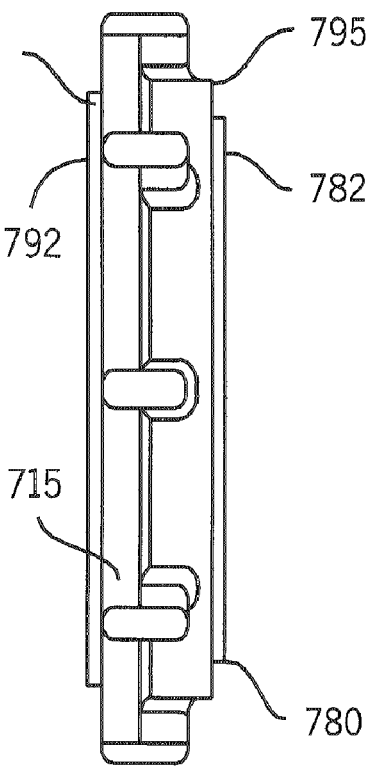
FIG. 8 shows a side view of a nut of a hole seal, in accordance with one embodiment.
Figure 9:
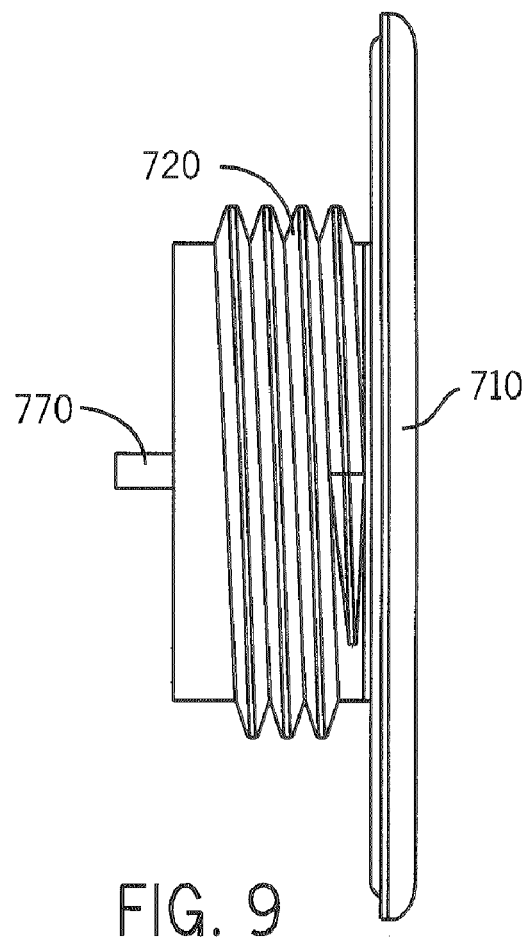
FIG. 9 shows a side view of a hole seal body, in accordance with one embodiment.

FIGS. 7, 8, and 9 shows a hole seal 700, in accordance with one embodiment. Hole seal 700 includes some of the same details as hole seal 200 described above and certain details will be omitted for the sake of brevity. FIG. 7 shows a perspective view of hole seal 700; FIG. 8 shows a side view of a nut 715 of hole seal 700; and FIG. 9 shows a side view of a hole seal body 710 of hole seal 700.

Hole seal 700 generally includes a body 710 and a nut 715. Body 710 includes a cylindrical threaded portion 720 and a cap end 725. An inner surface 730 of cap end 725 can include a gasket 735. In one example, body 710 is molded of a non-metallic material such as a plastic. A tab 770 can extend from an end of the body 710. Threaded portion 720 is a male threaded portion and is threaded to threadingly engage nut 715 at a female threaded portion 740 of nut 715.

Nut 715 includes a first outer flange 780 having first diameter on a first side 782, a second outer flange 790 having a second diameter on a second side 792, and a third flange 795 on the first side 782 having a third diameter. The flanges 780, 790, and 795 have different diameters so as to allow the nut 715 to be mounted to body 710 in at least three different size holes in an enclosure.

In using either of the embodiments discussed above, the installer places a hole seal body within a hole of an enclosure such that the male threaded portion of the hole seal body at least partially extends through the hole. The user then selectively chooses an orientation for a female threaded nut to engage the male threaded portion of the hole seal body. The selected outer flange of the nut will help center the hole seal over the hole and provide and tight seal of the hole.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A seal for an enclosure having a hole in a wall, the seal comprising:
   a body having a threaded portion and a cap end;
   a nut having an inner threaded portion to receive the threaded portion of the body, the nut including a first outer flange having first diameter and a second outer flange having a second diameter, larger than the first diameter; and
   the body including a gasket positioned between the cap end and one of the first outer flange and the second outer flange, the gasket and the one of the first outer flange and the second outer flange being configured to be secured to the wall of the enclosure to create a substantially waterproof seal of the hole,
   the cap end being positioned outside the enclosure and the nut being positioned inside the enclosure.

2. The hole seal of claim 1, wherein the first outer flange is on a first side of the nut and the second outer flange is on a second side of the nut.

3. The hole seal of claim 1, wherein the body and the nut are non-metallic.

4. The hole seal of claim 1, wherein the body includes a cap end on one end having an inner surface, the inner surface including the gasket.

5. The hole seal of claim 1, wherein the body includes a tab extending from the threaded portion.

6. A hole seal for an enclosure, comprising:
   a body having a threaded portion; and
   a nut having an inner threaded portion to receive the threaded portion of the body, the nut including a first outer flange having a first diameter and a second outer flange having a second diameter, larger than the first diameter;
   the nut including a third flange having a third diameter, different than the first diameter and the second diameter.

7. The hole seal of claim 1, wherein the nut is reversible such that the nut can be placed onto the threaded portion of the body from either side of the nut.

8. A hole seal for an enclosure having a hole in a wall, the seal comprising:
   a non-metallic body having a cap end and having a cylindrical threaded portion; and
   a non-metallic nut having an inner threaded portion to receive the threaded portion of the non-metallic body, the nut including a first outer flange having a first diameter and a second outer flange having a second diameter such that the nut is usable so as to matingly fit within at least two different size holes of an enclosure; and
   the non-metallic body including a gasket positioned between the cap end and one of the first outer flange and the second outer flange, the gasket and the one of the first outer flange and the second outer flange being configured to be secured to the wall of the enclosure in order to create a substantially waterproof seal of the hole;
   the cap end being positioned outside the enclosure and the nut being positioned inside the enclosure.

9. The hole seal of claim 8, wherein the first outer flange is on a first side of the nut and the second outer flange is on a second side of the nut.

10. The hole seal of claim 8, wherein the body includes a tab extending from the threaded portion.

11. A hole seal for an enclosure, comprising:
    a non-metallic body having a cap end and having a cylindrical threaded portion; and
    a non-metallic nut having an inner threaded portion to receive the threaded portion of the non-metallic body, the nut including a first outer flange having a first diameter and a second outer flange having a second diameter such that the nut is usable so as to matingly fit within at least two different size holes of an enclosure;
    the nut including a third flange having a third diameter.

12. The hole seal of claim 8, wherein an inner surface of the cap end includes the gasket.

13. A hole seal for an enclosure, comprising:
    a non-metallic body having a cap end and having a cylindrical threaded portion; and
    a non-metallic nut having an inner threaded portion to receive the threaded portion of the non-metallic body, the nut including a first outer flange having a first diameter, a second outer flange having a second diameter, and a third outer flange having a third diameter such that the nut is usable so as to matingly fit within at least three different size holes of an enclosure, wherein the first outer flange is on a first side of the nut and the second outer flange is on a second side of the nut.

14. The hole seal of claim 13, wherein the body includes a tab extending from the threaded portion.

15. The hole seal of claim 13, wherein an inner surface of the cap end includes a gasket.

16. A method comprising:
    placing a hole seal body within a hole of an enclosure such that a male threaded portion of the hole seal body at least partially extends through the hole; and
    selectively choosing an orientation for a female threaded nut to engage the male threaded portion of the hole seal body, the nut including a first outer flange having a first diameter and a second outer flange having a second diameter such that the nut matingly fits within at least two different size holes of an enclosure;
    the nut including a third flange having a third diameter.

* * * * *